United States Patent
Acciai et al.

(10) Patent No.: US 6,181,977 B1
(45) Date of Patent: Jan. 30, 2001

(54) CONTROL FOR TECHNIQUE OF ATTACHING A STIFFENER TO A FLEXIBLE SUBSTRATE

(75) Inventors: Michael Acciai, Newark Valley; David Martin Dewey-Wright, Owego; Daniel Paul White, Endwell, all of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/017,724

(22) Filed: Feb. 4, 1998

Related U.S. Application Data

(60) Provisional application No. 60/040,329, filed on Mar. 6, 1997.

(51) Int. Cl.[7] .................................................. G06F 19/00
(52) U.S. Cl. ........................................... 700/117; 700/121
(58) Field of Search .................................. 700/1, 7, 9, 11, 700/12, 22, 28, 95, 108, 117, 121, 122, 123

(56) References Cited

U.S. PATENT DOCUMENTS

| | | | | |
|---|---|---|---|---|
| 4,306,292 | * | 12/1981 | Head, III | 364/468 |
| 4,603,379 | * | 7/1986 | Strosser et al. | 364/130 |
| 5,265,004 | * | 11/1993 | Schultz et al. | 364/140 |
| 5,276,875 | * | 1/1994 | Satoh | 395/650 |
| 5,409,865 | * | 4/1995 | Karnezos | 437/210 |
| 5,873,162 | * | 2/1999 | Acciai et al. | 29/846 |

* cited by examiner

*Primary Examiner*—William Grant
*Assistant Examiner*—Zoila Cabrera
(74) *Attorney, Agent, or Firm*—Lawrence R. Fraley; Douglas M. Clarkson

(57) ABSTRACT

The control technique of the present invention includes a computer readable medium with several programs. A first program for controlling the steps that run a sequence of steps for setting certain devices in a start condition. A second program includes instructions for setting a start condition. A third program includes instructions for controlling a timer to set time intervals involved in the sequence of steps. A fourth program includes instructions for monitoring predetermined processes.

10 Claims, 7 Drawing Sheets

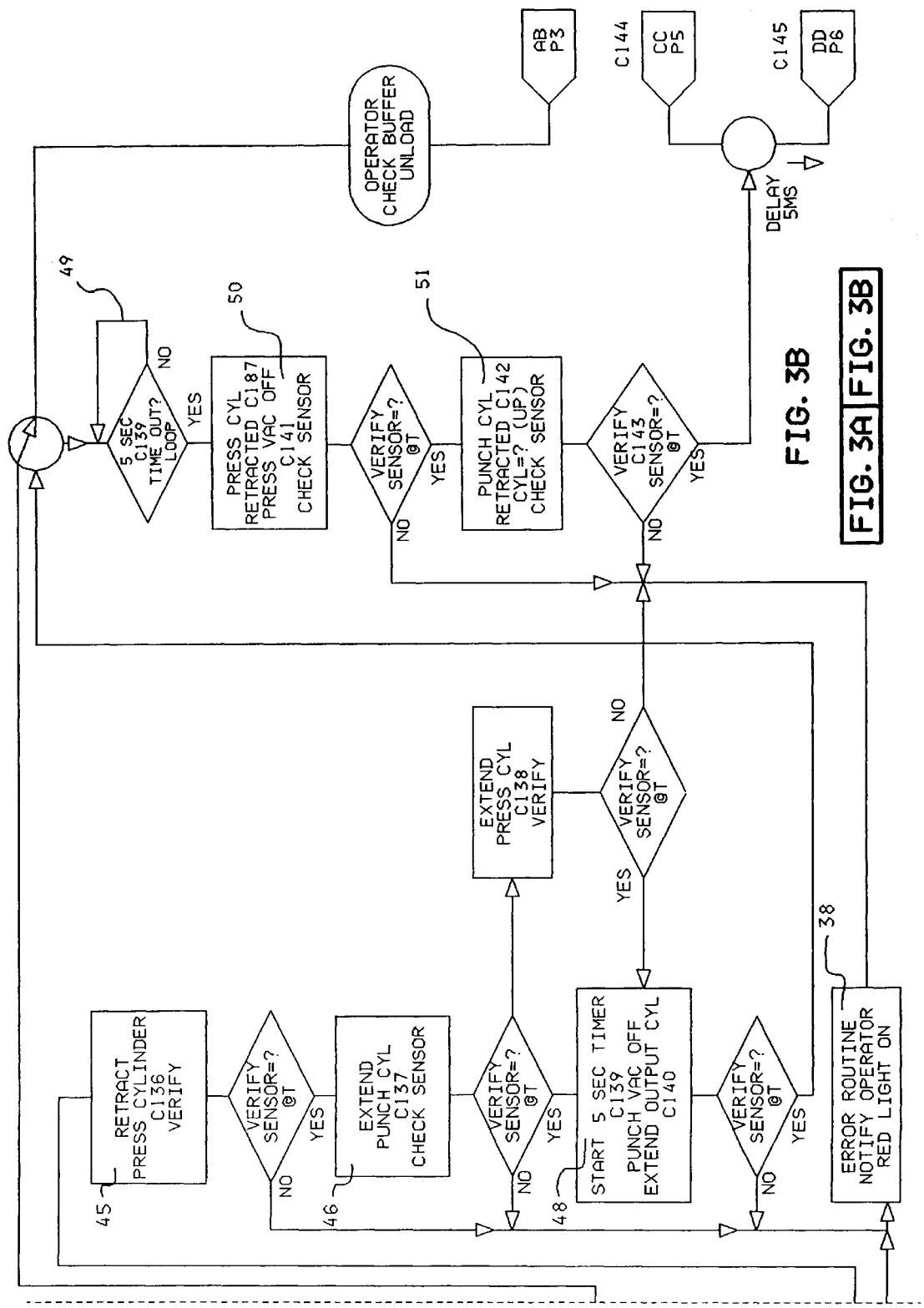

CONTROL FOR TECHNIQUE OF ATTACHING A STIFFENER TO A FLEXIBLE SUBSTRATE

Reference: The information, data and all benefits of provisional application No. 60/040,329 filed Mar. 6, 1997 are incorporated by reference into this description.

BACKGROUND OF THE INVENTION

1. Field of the Invention

The present invention, generally, relates to a control system for controlling the technique of attaching a stiffener to a flexible substrate.

2. Description of the Prior Art

With the dramatic increase in the number of circuits on a substrate today, both consumer confidence and maintenance of the competitive advantage in the market place require that the existing standards for electrical performance must be maintained.

A step in this direction has already been taken in the development of the Ball Grid Array for integrated circuit packages, which now is taken to another height by the use of flexible substrates. The ball grid array packages permit substantial increases in the number of circuit connections per unit area, but controlling the manufacturing techniques involved have produced problems that are quite real and difficult to solve. Expected solutions require increases in cost and results that at best can be inconsistant.

The control of a system of attaching a stiffener material to a flexible substrate having solder balls already attached, without damage to the solder balls, is more of a manufacturing problem than would occur to a casual observer. It is so realistic and formable of a problem that special tools and programs must be implemented in the manufacturing process to meet any quality yield objectives.

OBJECTS AND SUMMARY OF THE INVENTION

It is an object of the present invention to provide a way to control a technique for attaching a stiffener to a flexible substrate without disturbing solder balls on a surface of the substrate.

Another object of the present invention is to provide a way for controlling the power used during the attaching of a stiffener to a flexible substrate whereby the functioning of predetermined process devices are controlled in a pre-set manner.

Briefly, the control technique of the present invention includes a computer readable medium with four programs. A first program for controlling the steps that run a sequence of steps for setting certain devices in a start condition. A second program includes instructions for setting a start condition. A third program includes instructions for controlling a timer to set time intervals involved in the sequence of steps. A fourth program includes instructions for monitoring predetermined processes.

Other objects, features and advantages of the present invention will become more readily apparent from the following detailed description taken in conjunction with the accompanying drawings, a brief description of which follows.

BRIEF DESCRIPTION OF THE DRAWINGS

FIGS. 3A and 3B illustrate modular control for the transfer of a flexible substrate and for the transfer of a stiffener.

DETAILED DESCRIPTION OF THE INVENTION

Figure 1:
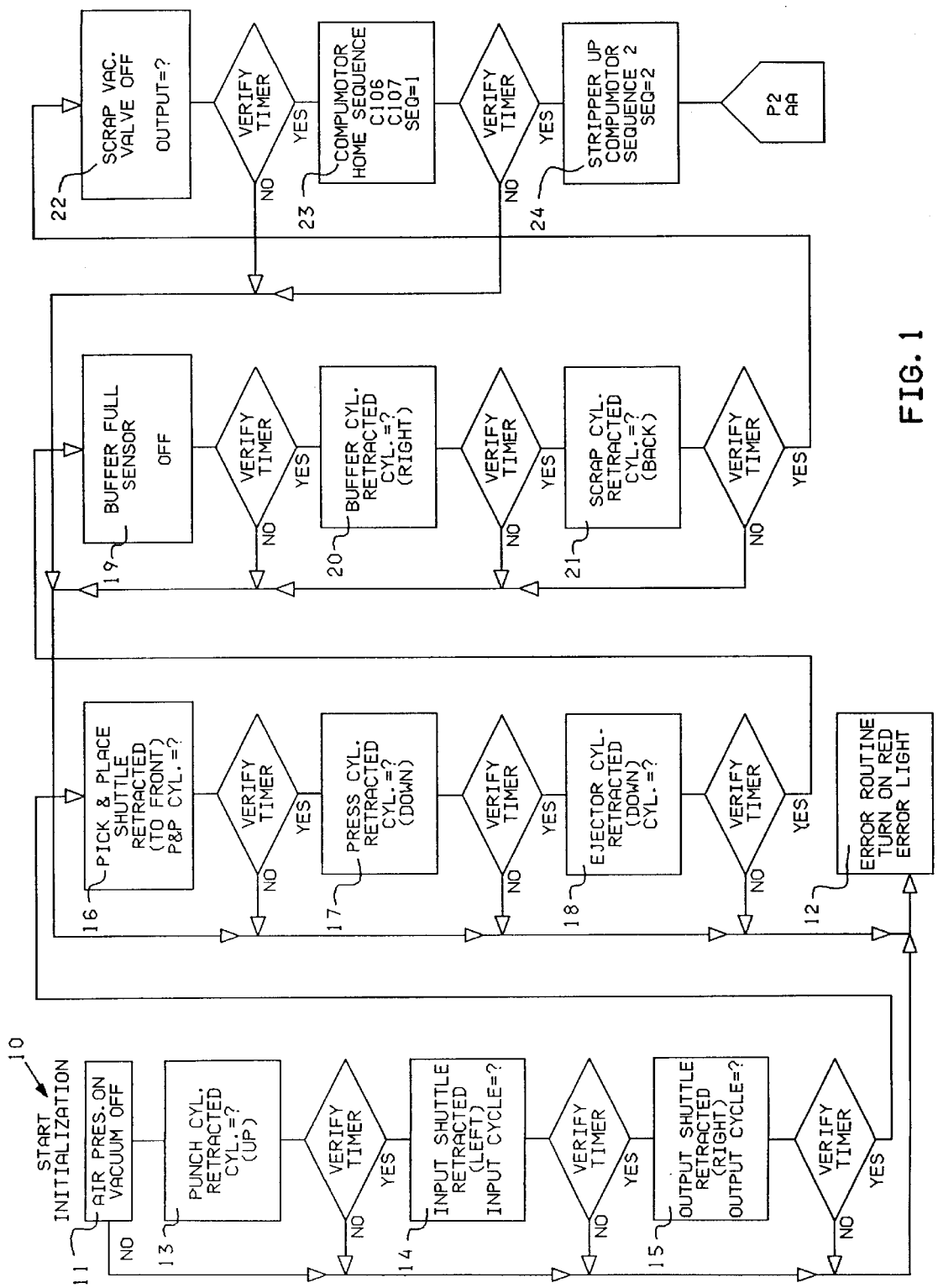
FIG. 1 is a flow chart illustrating modular control of power to a machine that runs a sequence of steps.

FIG. 1 of the drawings, is a flow chart that illustrates a technique, according to the invention, for control of the power to a machine that operates a sequence of steps to ensure that all electromechanical devices used in the process are in a correct position and/or state prior to allowing an operator to proceed with the manufacturing of parts.

This FIGURE illustrates that each device is commanded to a start/reset condition and is monitored by a feedback device. A verify timer is started allowing time for the feedback device to react to the start/reset command. If a correct status is not back at the end of the timer period, an error routine is initiated, and a fault status is displayed to the operator.

The procedure begins from a START INITIALIZATION (10) as follows:

Turn Air Pressure solenoid on, Vacuum solenoid off (11).
Verify feedback Sensors,
If NO go to ERROR ROUTINE, (12) turn on ERROR LIGHT,
If YES,
  Turn Punch Cylinder (13) OFF (Retract Punch),
Verify feedback Sensors,
If NO go to ERROR ROUTINE, turn on ERROR LIGHT,
If YES,
  Turn Input Shuttle Cylinder (14) OFF (Retract Shuttle),
Verify feedback Sensors,
If NO go to ERROR ROUTINE, turn on ERROR LIGHT,
If YES,
  Turn Output Shuttle Cylinder (15) OFF (Retract Shuttle),
Verify feedback Sensors,
If NO go to ERROR ROUTINE, turn on ERROR LIGHT,
If YES,
  Turn Pick & Place Cylinder (16) OFF (Retract to front),
Verify feedback Sensors,
If NO go to ERROR ROUTINE, turn on ERROR LIGHT,
If YES,
  Turn Press Cylinder (17) OFF (Retract down),
Verify feedback Sensors,
If NO go to ERROR ROUTINE, turn on ERROR LIGHT,
If YES,
  Turn Ejector Cylinder (18) OFF (Retract down),
Verify feedback Sensors,
If NO go to ERROR ROUTINE, turn on ERROR LIGHT,
If YES,
  Check Buffer Full Sensor (19) is OFF,
Verify feedback Sensors,
If NO go to ERROR ROUTINE, turn on ERROR LIGHT, If YES,
  Turn Buffer Cylinder (20) OFF (Retracted to right),
  Verify feedback Sensors,
  If NO go to ERROR ROUTINE, turn on ERROR LIGHT,
  If YES,
    Turn Scrap Cylinder (21) OFF (Retracted to back),
    Verify feedback Sensors,
    If NO go to ERROR ROUTINE, turn on ERROR LIGHT,
    If YES,
      Turn Scrap Vacuum (22) Solenoid OFF,
      Verify feedback Sensors,
      If NO go to ERROR ROUTINE, turn on ERROR LIGHT,
      If YES,
        Turn on Compumotor (23) Home Switch,
        Verify feedback Sensors,
        If NO go to ERROR ROUTINE, turn on ERROR LIGHT,
        If YES,
          Turn ON Compumotor Stripper Up (24) Switch,
          Go to FIG. 2 for an illustration of the SHUTTLE ROUTINE.

Figure 2:
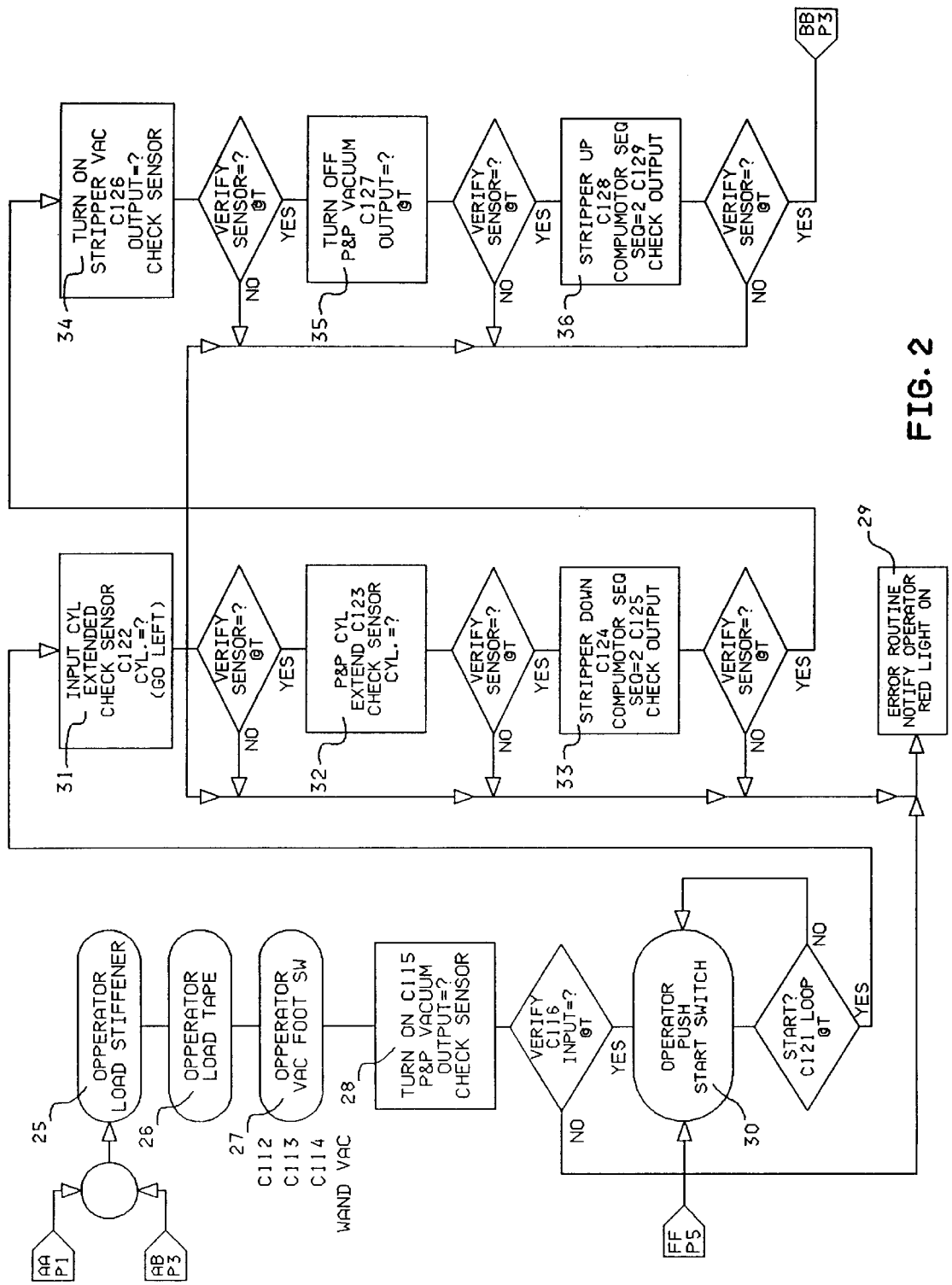
FIG. 2 illustrates modular control for a shuttle routine to a stripper plate for transferring flexible substrates from the input shuttle to a device via the stripper plate.

In FIG. 2 of the drawings, it is illustrated how modular control for a shuttle routine to a stripper plate is achieved in order to transfer flexible substrates from the shuttle to a TBGA punch using the stripper plate. The operator starts this procedure by a switch to turn on a hold-down vacuum after the substrate has been set on shuttle location pins.

The hold-down vacuum is verified, the shuttle is sent to the stripper plate transfer location, a stripper plate motor is commanded to a "down" position, the down position is verified and the vacuum is transferred from the shuttle to the stripper plate. Once verified, the stripper plate motor is commanded to an "up" position, thereby lifting the aligned substrate from the shuttle to a punch.

The transfer of the flexible substrate from the input shuttle to the punch is critical due to solder balls that are attached to the flexible material of the substrate. The motor that drives the punch is coded for a fast transfer with a deceleration profile as a flexible substrate approaches the punch.

At this point, the flexible substrate transfer is controlled, and damage to any of the solder balls is avoided. The software involved for this transfer routine is in the motor controller. If a "correct" status is not achieved by the end of the timer period, an "error" routine is initiated, and an error status is displayed to the operator.

The procedure begins from a OPERATOR LOAD STIFFENER step, as follows:
  The Operator (25) loads a stiffener on the Input Shuttle.
  The Operator (26) loads tape on the Pick & Place Shuttle.
  The Operator (27) depresses the Vacuum On Foot Switch.
  Turn ON Pick & Place Vacuum (28) Solenoid,
  Verify feedback Sensors,
  If NO go to ERROR ROUTINE (29), turn on ERROR LIGHT,
  If YES,
    Monitor START SWITCH (30) input until it is turned ON,
  When YES,
    Turn Input Shuttle Cylinder (31) ON (Extend Shuttle),
    Verify feedback Sensors,
    If NO go to ERROR ROUTINE, turn on ERROR LIGHT,
    If YES,
      Turn Pick & Place Cylinder (32) ON (Extend Pick & Place),
      Verify feedback Sensors,
      If NO go to ERROR ROUTINE, turn on ERROR LIGHT,
      If YES,
        Turn ON Stripper Down (33) Switch to Compumotor,
        Verify feedback Sensors,
        If NO go to ERROR ROUTINE, turn on ERROR LIGHT,
        If YES,
          Turn Stripper Vacuum (34) Solenoid ON,
          Verify feedback Sensors,
          If NO go to ERROR ROUTINE, turn on ERROR LIGHT,
          If YES,
            Turn Pick & Place Vacuum (35) Solenoid OFF,
            Verify feedback Sensors,
            If NO go to ERROR ROUTINE, turn on ERROR LIGHT,
            If YES,
              Turn ON Stripper Up (36) Switch to Compumotor,
              Verify feedback Sensors,
              If NO go to ERROR ROUTINE, turn on ERROR LIGHT,
              If YES,
                Go to FIG. 3 for the SHUTTLE & PUNCH/PRESS ROUTINE.

Figure 3A:
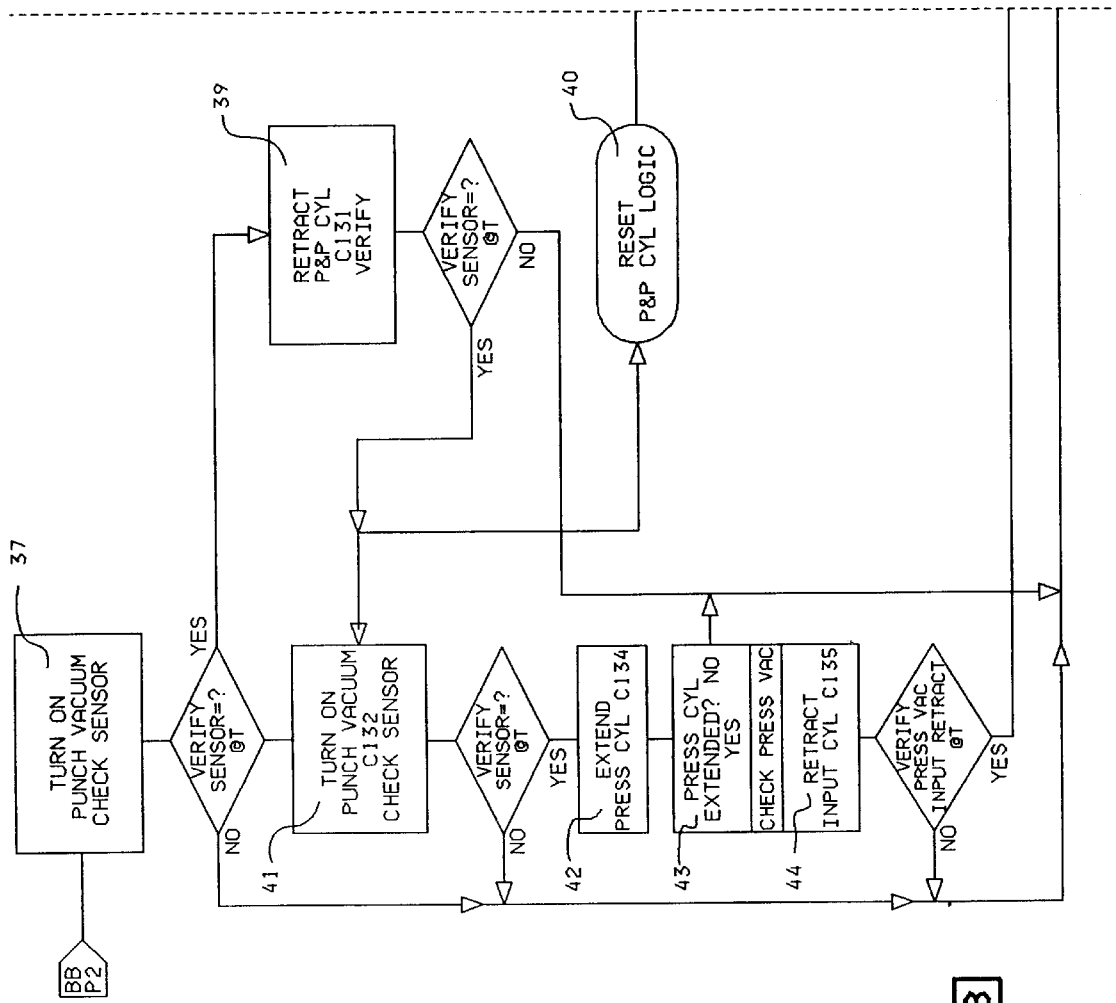

FIGS. 3A and 3B of the drawings illustrates a modular control of a punch device and a press device for transferring a flexible substrate to the punch and for transferring a stiffener to the press. When these procedures are verified by a switch feedback, the input shuttles are commanded to "home" (or "reload") positions for the start of a new cycle.

At this point in the sequence of steps, the punch is commanded to a "down" position, the flexible substrate is cut to size and the press with a stiffener held in position by vacuum is commanded to an "up" location. The process timer is started and the pressure is increased to perform the attachment of the stiffener to the substrate.

The output shuttle is commanded to a position under the press for the eventual removal of the flexible substrate and stiffener assembly. Pressure transducers monitor for even pressure around the substrate and also signal a possible jam condition.

If no error is detected, the process timer will signals for the punch and press to be retracted, the vacuum is turned off and the substrate/stiffener assembly is set into an output nest for transfer to a part output buffer. If an error is detected, the error routine is initiated, and an error is posted to the operator.

The procedure starts at TURN ON PUNCH VACUUM, as follows:
  Turn Punch Vacuum (37), FIG. 3A, Solenoid ON,
  Verify feedback Sensors,
  If NO go to ERROR ROUTINE, turn on ERROR LIGHT (38), FIG. 3B,
  If YES,
    Turn Pick & Place Cylinder (39) OFF (Retract),
    Verify feedback Sensors,
    If NO go to ERROR ROUTINE, turn on ERROR LIGHT,
    If YES,
      Reset Pick & Place Cylinder Logic (40),
      (Operator can now load new Tape for next machine cycle)
      Turn ON Press Vacuum (41),
      Verify feedback Sensors,
      If NO go to ERROR ROUTINE, turn on ERROR LIGHT,
      If YES,
        Extend Press Cylinder (42),
        Check Press VACUUM (43),
        Verify feedback Sensors,
        If NO go to ERROR ROUTINE, turn on ERROR LIGHT,
        If YES, Retract Input Cylinder (44),
Verify feedback Sensors,
If NO go to ERROR ROUTINE, turn on ERROR LIGHT,
If YES,
    Check Press VACUUM Switch ON,
Verify feedback Sensors,
If NO go to ERROR ROUTINE, turn on ERROR LIGHT,
If YES,
    Retract Press Cylinder (45),
Verify feedback Sensors,
If NO go to ERROR ROUTINE, turn on ERROR LIGHT,
If YES,
    Extend Punch Cylinder (46)
Verify feedback Sensors,
If NO go to ERROR ROUTINE, turn on ERROR LIGHT,
If YES,
    Extend Press Cylinder (47)
Verify feedback Sensors,
If NO go to ERROR ROUTINE, turn on ERROR LIGHT,
If YES,
    Start 5 second (48),
    Turn Punch Vacuum Solenoid OFF,
    Extend Output Cylinder,
Verify feedback Sensors,
If NO go to ERROR ROUTINE, turn on ERROR LIGHT,
If YES,
    Monitor 5 Second Timer (49) Switch, LOOD
Verify Timer Switch,
If NO go back and check the Timer Switch again,
If YES,
    Turn Press Cylinder (50) OFF (Retract Press)
Verify feedback Sensors,
If NO go to ERROR ROUTINE, turn on ERROR LIGHT,
If YES,
    Turn Punch Cylinder (51) OFF (Retract Punch),
Verify feedback Sensors,
If NO go to ERROR ROUTINE, turn on ERROR LIGHT,
If YES,
Go to FIG. 4 for an illustration of the UNLOAD SHUTTLE & BUFFER ROUTINE.

Figure 4:
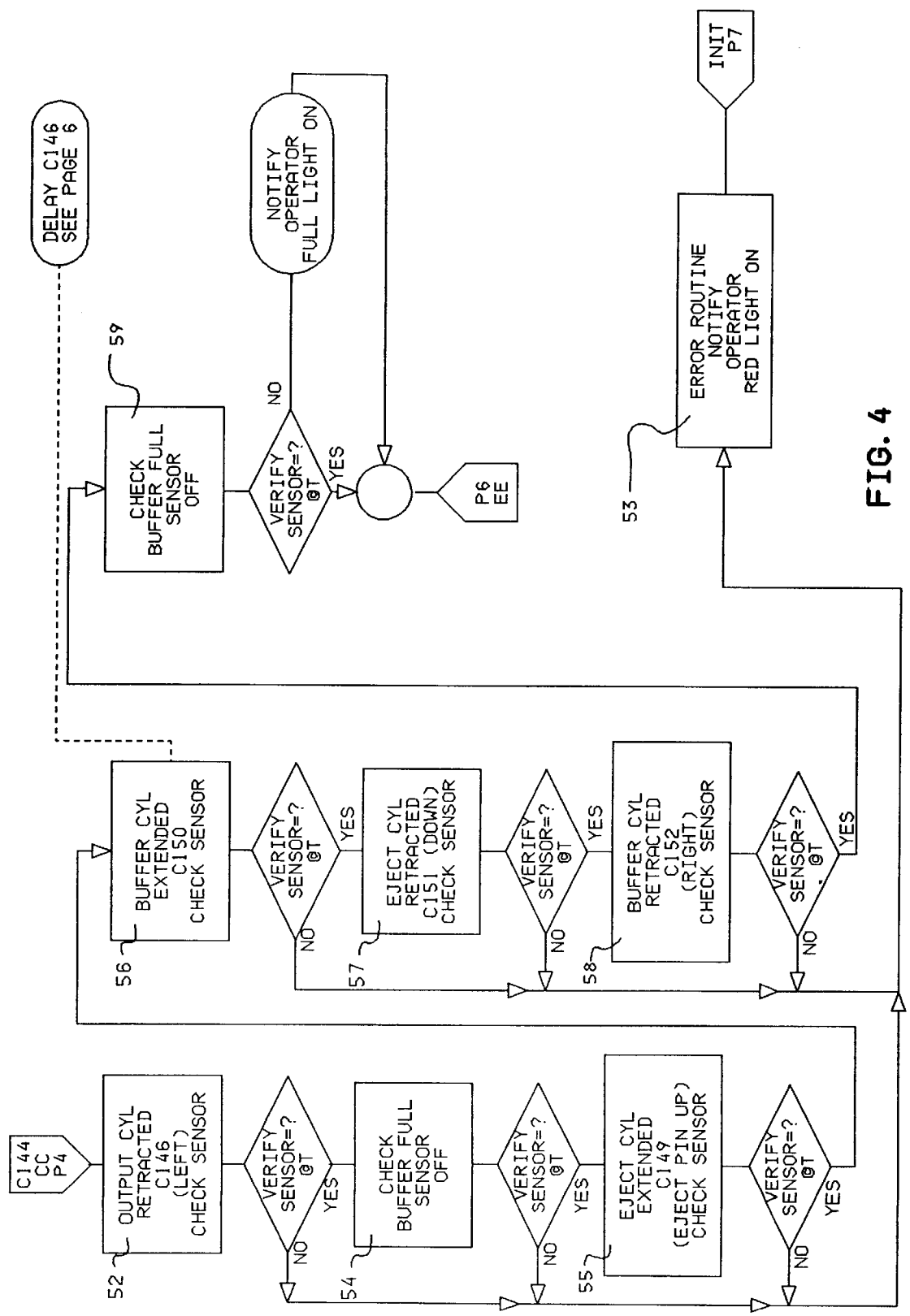
FIG. 4 illustrates modular control for a shuttle and for a buffer and for checking an output buffer for parts.

In FIG. 4 of the drawings, a modular control procedure is illustrated for unload shuttle and buffer routines. This routine controls the output shuttle and checks the output buffer for any parts that may be stacked up for removal. If parts are not removed and the buffer fills up, the process is stopped, and the operator is notified by a "buffer full" light. If any shuttle process is not completed by the end of the timer period, an error is entered, and the operator is notified.

Figure 5:
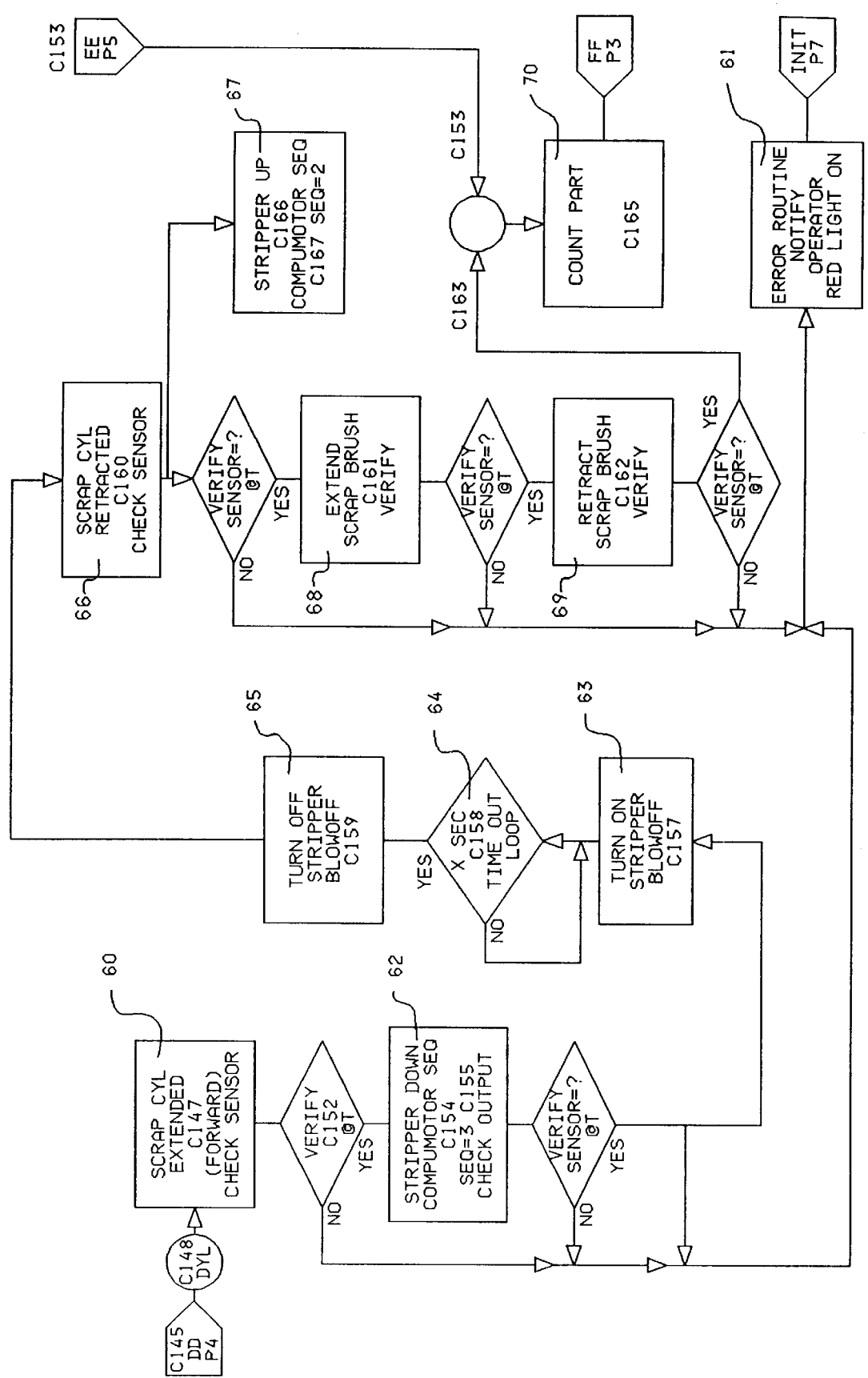
FIG. 5 illustrates a routine for running simultaneously with the routine of FIG. 4 and for removing scrap material.

The procedure begins from the OUTPUT CYLINDER RETRACTED step:
    Turn Output Shuttle Cylinder (52) OFF (Retract)
    Verify feedback Sensors,
    If NO go to ERROR ROUTINE, (53) turn on ERROR LIGHT,
    If YES,
        Check for Buffer Full (54) Switch equals OFF,
    Verify feedback Sensors,
    If NO go to ERROR ROUTINE, turn on ERROR LIGHT,
    If YES,
        Turn Eject Cylinder (55) ON (Extend),
    Verify feedback Sensors,
    If NO go to ERROR ROUTINE, turn on ERROR LIGHT,
    If YES,
        Turn Buffer Cylinder (56) ON (Extend),
    Verify feedback Sensors,
    If NO go to ERROR ROUTINE, turn on ERROR LIGHT,
    If YES,
        Turn Eject Cylinder (57) OFF (Retract),
    Verify feedback Sensors,
    If NO go to ERROR ROUTINE, turn on ERROR LIGHT,
    If YES,
        Turn Buffer Cylinder (58) OFF (Retract),
    Verify feedback Sensors,
    If NO go to ERROR ROUTINE, turn on ERROR LIGHT,
    If YES,
        Check Buffer Full (59) Switch,
    If ON,
        Notify Operator, Turn Buffer Full Light ON,
    Then go to: FIG. 5: Scrap Extraction Routine
    If OFF,
    Go to FIG. 5 for an illustration of the SCRAP EXTRACTION ROUTINE step.

FIG. 5 of the drawings illustrates a scrap extraction routine that runs simultaneously with the routine described supra in FIG. 4, which also removes any scrap flexible kerf from the stripper plate that may remain after a sizing step is completed. At this point, the punch assembly is in the "up" position, the scrap removal plate is commanded into place directly beneath the stripper/punch assembly, the vacuum is removed and the stripper is commanded to a "down" position forcing scrap off the punch.

The scrap removal plate now is retracted, and a brush is commanded to push scrap pieces into a bin. When the bin is full, the scrap pieces are sent for copper reclamation.

The procedure starts at the SCRAP CYLINDER EXTENDED step:
    Turn Scrap Cylinder (60) ON (Extend),
    Verify feedback Sensors,
    If NO go to ERROR ROUTINE (61), turn on ERROR LIGHT,
    If YES,
        Turn ON Sequence 3 Switch to Compumotor (Stripper Down) (62),
    Verify feedback Sensors,
    If NO go to ERROR ROUTINE, turn on ERROR LIGHT,
    If YES,
        Turn Stripper Blowoff (63) Solenoid ON,
    Start 2 Second Timer,
        Check Timer Switch (64) for ON,
    If no, keep checking Timer Switch,
    If YES,
        Turn Stripper Blowoff (65) Solenoid OFF,
        Turn Scrap Cylinder (66) OFF (Retract),
    Turn ON Sequence 2 Switch to Compumotor (67) (Stripper Up),
    Verify feedback Sensors,
    If NO go to ERROR ROUTINE, turn on ERROR LIGHT,
    If YES,
        Turn Scrap Brush Cylinder (68) ON (Extend),
    Verify feedback Sensors,
    If NO go to ERROR ROUTINE, turn on ERROR LIGHT,
    If YES,
        Turn Scrap Brush Cylinder (69) OFF (Retract),
    Verify feedback Sensors,
    If NO go to ERROR ROUTINE, turn on ERROR LIGHT,
    If YES,
        Increment Part Counter (70), Go to FIG. 2 at the OPERATOR PUSH START SWITCH STEP.

Figure 6:
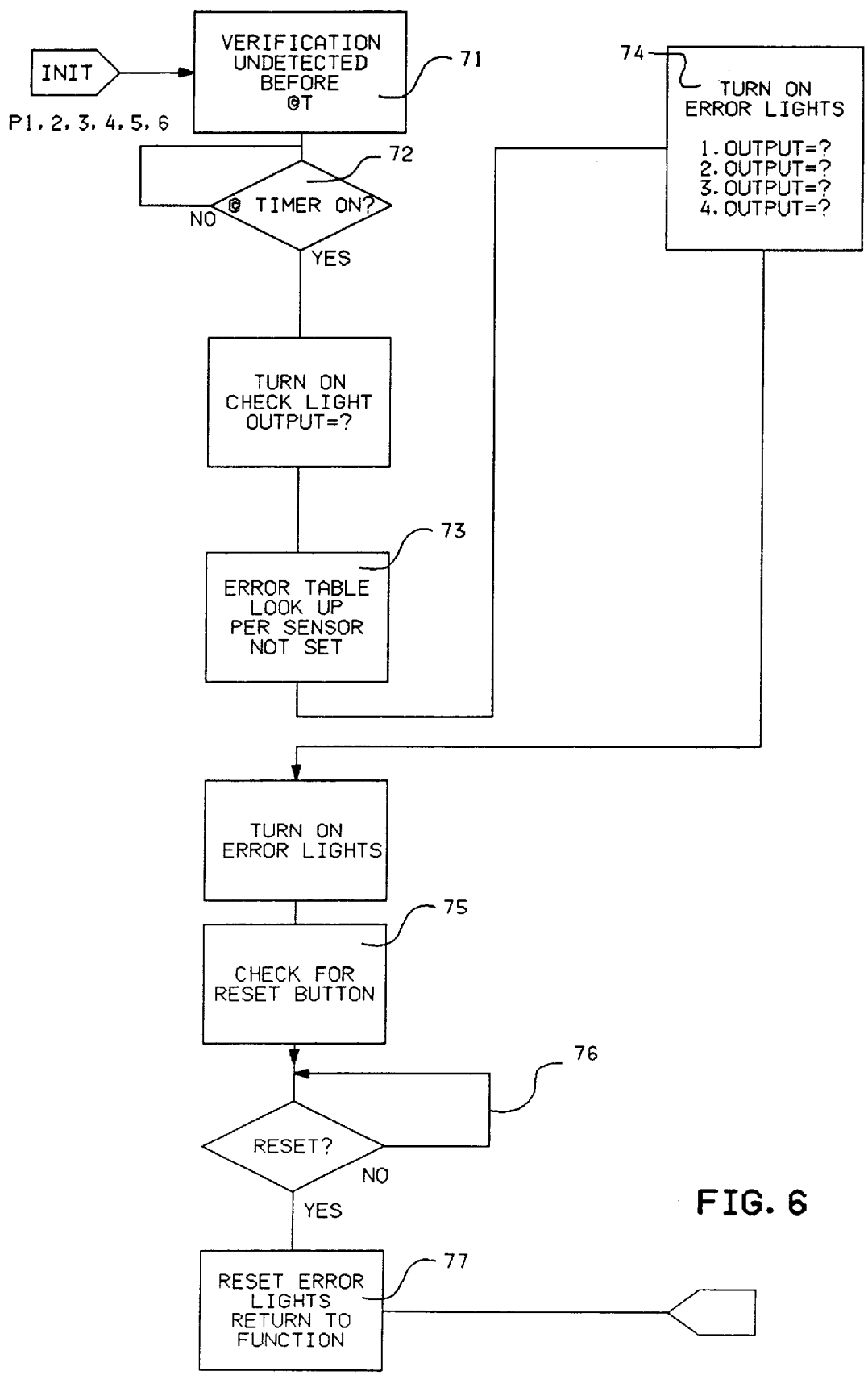
FIG. 6 illustrates control of error and recovery routines when a condition is detected.

FIG. 6 of the drawings illustrates control, according to the present invention, of ERROR AND RECOVERY ROUTINES that are entered when an "incorrect" or a "not present" condition is detected after the timer period ends. A machine "fault" light is illuminated to notify the operator, and a look-up table is entered to determine the area of the machine that is affected.

These error routines are coded into a HEX display, and an appropriate set of lights are illuminated indicating the error. The error is latched and held until corrected or reset.

This procedure starts at the VERIFICATION UNDETECTED BEFORE @ T step (71), as follows:

Check for @ Timer Switch ON (72),
If YES,
Check Sensor Switch NOT ON,
Look Up Error Code in Table (73),
Turn ON Error Code Lights (74),
Check for Reset Switch ON (75),
If NO, Continue to Check Reset Switch (76),
If Yes,
Return to Function that caused the ERROR (77).

The present invention, described in detail above, includes the control details for the technique and/or method of attaching a stiffening material to a flexible substrate by which control the advantages it provides are available. These control details are subject to variations and modifications that will occur to one skilled in this art.

Accordingly, the scope of the present invention is intended to be defined by the following claims.

What is claimed is:

1. A control system to control a technique for attaching substantially rigid stiffener means to a flexible substrate having solder balls, and for controlling the power used in attaching stiffening means to a flexible substrate, said control system comprising:

locating a flexible tape, having at least one circuit with a plurality of solder balls, for support by support means having a vacuum chamber;

applying a vacuum to said vacuum chamber to hold said flexible tape on said support means;

moving punch means having means defining a plurality of recesses matching the location of said solder balls so that a space is defined about said solder balls when said punch means is moved to engage said tape;

applying a vacuum to said space about said solder balls so that said flexible tape is supported against said punch means when said vacuum is released on said support means;

removing said support means from supporting said flexible tape, and moving a die means into substantially the same location of said support mean;

moving said punch means relative to said die means to cut a flexible substrate with said solder balls from said flexible tape;

replacing said die means with a stiffener means having a pressure sensitive adhesive;

applying a pressure around said solder balls against said flexible substrate in the order of 2000 pounds per square inch to force said flexible substrate and said stiffener means together;

a computer readable medium;

providing a compliant block support for said stiffening means;

holding said flexible substrate stationary while moving said stiffening means to a position against said flexible substrate;

first program instruction means for controlling electromechanical means that runs a sequence of steps for setting predetermined process devices in a start condition;

second program instruction means for setting a start condition for predetermined ones of said process devices;

third program instruction means for controlling timer means to control and to set time intervals for preselected steps in said sequence of steps; and fourth program instruction means for monitoring predetermined ones of said process devices;

whereby the functioning of predetermined ones of said process devices is controlled to function in a pre-set manner.

2. A computer program product as defined by claim 1 wherein said computer readable medium is a compact disc.

3. A computer program product as defined by claim 1 wherein said computer readable medium is magnetic tape means.

4. A method to control a technique for attaching substantially rigid stiffener means to a flexible substrate having solder balls, comprising:

supporting said stiffener means, with a pressure sensitive adhesive, by support means;

drawing a vacuum to hold said stiffener means on said support means against said pressure sensitive adhesive on said stiffener means;

locating said flexible substrate on said stiffener means with said solder balls facing away from said stiffener means;

drawing a vacuum to hold said flexible substrate on said stiffener means;

applying a pressure around said solder balls against said flexible substrate in the order of 2000 pounds per square inch to force said flexible substrate against said stiffener means;

providing a computer readable medium;

connecting a plurality of programs, from said medium, having instruction means for controlling electromechanical means that run a sequence of steps for setting predetermined process devices to a predetermined condition;

whereby the functioning of predetermined ones of said process devices is controlled to function in a pre-set manner.

5. A method to control a technique for attaching substantially rigid stiffener means to a flexible substrate having solder balls, comprising:

locating a flexible tape, having at least one circuit with a plurality of solder balls, for support by support means having a vacuum chamber;

applying a vacuum to said vacuum chamber to hold said flexible tape on said support means;

moving punch means having means defining a plurality of recesses matching the location of said solder balls so that a space is defined about said solder balls when said punch means is moved to engage said tape;

applying a vacuum to said space about said solder balls so that said flexible tape is supported against said punch means when said vacuum is released on said support means;

removing said support means from supporting said flexible tape, and moving a die means into substantially the same location of said support mean;

moving said punch means relative to said die means to cut a flexible substrate with said solder balls from said flexible tape;

replacing said die means with a stiffener means having a pressure sensitive adhesive;

applying a pressure around said solder balls against said flexible substrate in the order of 2000 pounds per square inch to force said flexible substrate and said stiffener means together;

providing a computer readable medium;

connecting a plurality of programs, from said medium, having instruction means for controlling electromechanical means that run a sequence of steps for setting predetermined process devices to a predetermined condition;

providing at least one of said plurality of programs for setting a start condition for predetermined ones of said process devices;

providing one of said plurality of programs for monitoring predetermined ones of said process devices;

whereby the functioning of predetermined ones of said process devices is controlled to function in a pre-set manner.

6. A method to control a technique for attaching substantially rigid stiffener means to a flexible substrate having solder balls, comprising:

providing a compliant block support means having a vacuum chamber for said stiffener means;

locating a flexible tape, having at least one circuit with a plurality of solder balls, for support by said support means;

applying a vacuum to hold said flexible substrate substantially stationary on said support means;

moving punch means having means defining a plurality of recesses matching the location of said solder balls so that a space is defined about said solder balls when said punch means is moved to engage said tape;

applying a vacuum to said space about said solder balls so that said flexible tape is supported against said punch means when said vacuum is released on said support means;

removing said support means from supporting said flexible tape, and moving a die means into substantially the same location of said support mean;

moving said punch means relative to said die means to cut a flexible substrate with said solder balls from said flexible tape;

moving said stiffener means to a position against said flexible substrate;

replacing said die means with a stiffener means having a pressure sensitive adhesive intermediate said flexible substrate and said stiffener means for attaching said stiffener means and said flexible substrate;

applying a pressure around said solder balls against said flexible substrate in the order of 2000 pounds per square inch to force said flexible substrate and said stiffener means together;

a computer readable medium;

a plurality of programs having instruction means for controlling electromechanical means that run a sequence of steps for setting predetermined process devices to a predetermined condition;

at least one of said plurality of programs adapted for setting a start condition for predetermined ones of said process devices;

whereby the functioning of predetermined ones of said process devices is controlled to function in a pre-set manner.

7. A method to control a technique as defined by claim 6 wherein said computer readable medium is a compact disc.

8. A method to control a technique as defined by claim 6 wherein said computer readable medium is magnetic tape means.

9. A method to control a technique as defined by claim 6 wherein said computer readable medium includes at least one program instruction means for controlling timer means to control pre-selected steps in said sequence of steps.

10. A method to control a technique as defined by claim 6 wherein said computer readable medium includes at least one program instruction means for monitoring predetermined ones of said process devices.

* * * * *